United States Patent [19]

Buchl

[11] Patent Number: 4,706,619
[45] Date of Patent: Nov. 17, 1987

[54] AUTOMOTIVE VALVE ACTUATION METHOD

[76] Inventor: Josef Buchl, Rehsteig 12, Lenting, Fed. Rep. of Germany

[21] Appl. No.: 855,846

[22] Filed: Apr. 24, 1986

[30] Foreign Application Priority Data

Apr. 25, 1985 [DE] Fed. Rep. of Germany ....... 3515039

[51] Int. Cl.$^4$ .......................... F01L 1/18; H01H 47/32
[52] U.S. Cl. .................................. 123/90.11; 123/490; 361/154; 361/190
[58] Field of Search ............................ 123/490, 90.11; 361/154, 190

[56] References Cited

U.S. PATENT DOCUMENTS

| | | | |
|---|---|---|---|
| 3,268,776 | 8/1966 | Reed | 361/154 |
| 3,700,985 | 10/1972 | Applequist | 361/154 |
| 4,180,026 | 12/1979 | Schulzke | 361/154 |
| 4,266,261 | 5/1981 | Streit | 361/154 |
| 4,355,619 | 10/1982 | Wilkinson | 123/490 |
| 4,360,855 | 11/1982 | Ohba | 123/490 |
| 4,377,144 | 3/1983 | Takahashi | 361/154 |
| 4,452,210 | 6/1984 | Sasayama | 123/490 |
| 4,599,674 | 7/1986 | Ishikawa | 361/190 |

Primary Examiner—Ronald B. Cox
Attorney, Agent, or Firm—Jacques M. Dulin; Thomas Schneck

[57] ABSTRACT

A circuit and method for actuation of a gas intake or exhaust valve which is electromagnetically held in its opened and closed positions by an actuator assembly having a ferromagnetic element attractable by actuating solenoids. Control of the holding current flow through the solenoid coil is provided by a relaxation circuit element, and the excitation current is directly monitored and measured. Upon deexcitation of the coil and relaxation circuit-element activation, the decay current is not measured but is instead simulated. The relaxation circuit is supplied with pulsed current during the stationary phase of the valve, the current being measured in the pulse cycle during current supply, and is turned off upon exceeding a ceiling value. After the decay current has reached a threshold value, the current is turned on and permitted to rise momentarily. It is thereafter cycled off and on between an $I_1$ and $I_2$ value which is only about 10–20% of $I_{max}$, the capture current.

2 Claims, 4 Drawing Figures

AUTOMOTIVE VALVE ACTUATION METHOD

FIELD

The invention relates to a method for actuation of a gas intake or exhaust valve of the type found in internal combustion engines. The invention further provides a corresponding circuit for implementation of the procedure. More particularly, the circuit and method relate to electromagnetically-actuated reciprocating actuators, such as lifting valves in engines and the like. The reciprocating actuators typically have a spring system and two electrically-operated actuating solenoids, by means of which a ferromagnetic anchor plate member of the actuator assembly may be moved between two, discrete, mutually-opposite operating positions, such as a valve open and a valve closed position. The circuit provides power to the solenoid coil to control the capture (attraction to), holding on, and release of the ferromagnetic anchor plate from the solenoid core face. The circuit is particularly useful for powering and control of the actuators of intake and exhaust valves of internal combustion engines.

BACKGROUND

DE-OS No. 30 24 109 describes a gas intake or exhaust valve for an internal combustion engine which is pushed by a spring system into its open and closed positions and held in the corresponding position by excitation of a solenoid.

Due to the high holding force to be applied by the solenoid, the current source required for the solenoids must supply a relatively high current. In particular, the capture current is relatively high, whereas the gas intake or exhaust valve may be held after capture by relatively low current levels.

There is thus a need in the art for improved solenoid power and control circuits.

THE INVENTION

Objects

It is among the objects of the invention to provide a highly-efficient solenoid control system of simple, operationally-reliable construction.

It is another object of the invention to provide an improved method for powering and controlling gas intake or exhaust valve solenoids in which the solenoid is associated with a relaxation circuit supplied with pulsed current during the stationary phase of the valve, the current being measured in the pulse cycle during current supply and is turned off upon exceeding a ceiling value, and the current decay curve during the turn-off phase being simulated, and in which the current is turned on again after the simulated curve has reached a threshold value.

It is another object of the invention to provide an improved circuit for powering and controlling gas intake or exhaust valve solenoids having a current-switching element, a parallel-connected transistor, an ohmic resistor series-connected to the parallel circuit, a control component whose input valve is the voltage drop across the ohmic resistor and which drives both the transistor and the current-switching element.

Still other objects will be evident from the specification, drawings and claims.

DRAWINGS

In the following, the invention will be described with reference to the drawings, in which.

SUMMARY

Figure 1:
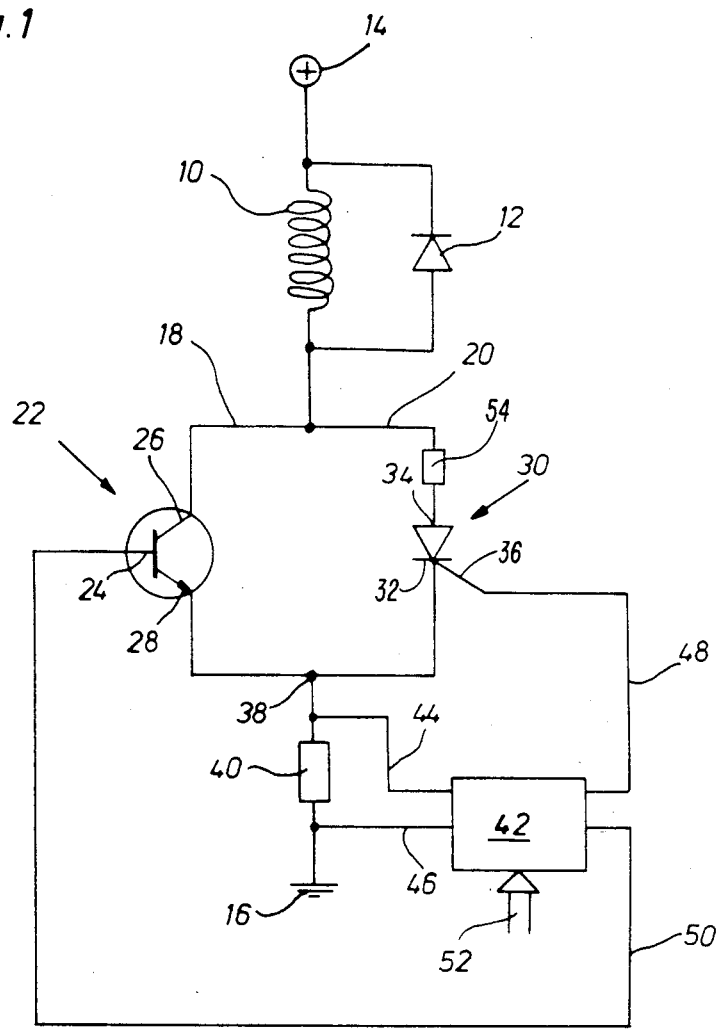
FIG. 1 is a schematic of a control circuit in accord with the invention.

Pursuant to the invention, the circuit for the actuating solenoid comprises a relaxation circuit element fed with a heavy excitation current followed by a pulsed current at a low RMS value. A comparable function is theoretically known from DE-OS No. 28 28 678.

The difficulty arises herein that the limit values between which the current must vary must be monitored during the pulsed phase. For reasons of power consumption, the current must not exceed a given ceiling value. At the same time, it must not fall below a given threshold value, to ensure the required solenoid holding force.

It is a costly procedure to individually monitor and evaluate both the ceiling and the threshold current values. Pursuant to the invention, construction of the device is simplified by the fact that only the ceiling value is monitored and measured during the pulsed phase, whereas, on the basis of the ceiling value, the decay current flowing upon in interruption of the supply voltage, i.e., the current flowing through the relaxation circuit element, is not monitored by direct measurement, but is instead simulated. As soon as this current has fallen below a minimum value designated as the threshold value, the supply voltage is again applied and the corresponding current rise measured.

In this way, the invention makes possible removing the ohmic resistance, by means of which current flow is measured on the basis of the corresponding voltage drop, from the vicinity of the grounding terminal. Measurement is thus simplified and no filters are required for elimination of parasitics.

The method of the invention is characterized by associating the solenoid with a relaxation circuit supplied with pulsed current during the stationary phase of the gas intake or exhaust valve. This current is measured in the pulse cycle during current supply and is turned off upon reaching a predetermined ceiling value. The current decay curve during the turnoff phase is simulated, and the current is turned on again after the simulated curve has reached a threshold value.

The circuit of the invention is characterized by a solenoid in parallel with a relaxation circuit element and having a circuit connected thereto comprising a current-switching element, a parallel-connected transistor, an ohmic resistor series-connected to the parallel switching and transistor circuit, and a control component whose input value is the voltage drop across the ohmic resistor and which drives both the transistor and the current-switching element.

In preferred embodiments, the current-switching element is a thyristor triggered by the control component, which thyristor is turned off by brief conduction by the transistor. Further, upon conduction by the transistor, peak power dissipation is greater than admissible continuous power dissipation. The thyristor is triggered during a pulse cycle in the excitation phase, and is turned off by saturation of the transistor when the ceiling current value has been reached. The thyristor carries only the primary excitation current, and the subsequent pulsing phase is taken over by the transistor. One terminal of the ohmic resistor is directly connected to ground.

DETAILED DESCRIPTION OF THE BEST MODE OF THE INVENTION

FIG. 1 shows the construction of a control circuit pursuant to the invention. The gas intake or exhaust valves, are not shown. The valves are held in their open and closed positions, respectively, by a solenoid, shown in schematic as solenoid coil 10. A relaxation circuit element 12, shown here in its simplest form as a diode 12, is associated with solenoid 10. The positive supply voltage is at terminal 14, and ground is at terminal 16. The parallel circuit formed by solenoid coil 10 and diode 12, whose cathode is at the positive terminal 14 and whose anode is at a negative connection, is connected to a control circuit divided into two branch circuits 18 and 20. Branch circuit 18 connects the side of coil 10 most distant from positive terminal 14 through the collector-emitter junctions of transistor 22 and through bypass resistor 40 to ground terminal 16. Branch circuit 20 is parallel to branch circuit 18 and connects the same terminal of coil 10 to ground terminal 16 by means of thyristor 30 and bypass resistor 54.

Collector 26 of transistor 22 is connected to the coil 10, while emitter 28 is connected through bypass resistor 40 to ground terminal 16. The junction 38 of both branch circuits, located just ahead of ground terminal 16, is connected to ground terminal 16 through bypass ohmic resistor 40, to be described in greater detail below.

Anode 34 of thyristor 30 in branch circuit 20 is connected to the coil 10, while cathode 32 is connected to point 38 where branch circuits 18 and 20 are joined. Gate 36 of the thyristor 30 is driven by one output 48 of control component 42, while the second output 50 of control component 42 leads to base 24 of transistor 22.

The two inputs 44 and 46 of control component 42 sample the voltages present across ohmic resistor 40. As indicated by conductor bus 52, control component 42 also receives signals which permit control of transistor 22 and thyristor 30 independently of other engine parameters.

In the following, the method and operation of the circuit of the invention will be explained with reference to the current flow through coil 10 illustrated in FIG. 2.

A relatively high capture current is required for capture of the gas intake or exhaust valves, when the gas exchange valves as described in DE-OS No. 30 24 109 are to be attracted into their open or closed positions by solenoid 10. Upon application of voltage, current rises to a value $I_{max}$ as a pulse is delivered from output 48 of control component 42 to gate 36 of thyristor 30, causing the thyristor to turn on and excitation current to rise. Current rise, i.e., the momentary current value, is determined by means of control component 42 sampling the voltage drop across ohmic resistor 40 via inputs 44 and 46.

Ohmic resistor 40 has a relatively low resistance value, which value must be sufficient to cause a measurable voltage drop. Values on the order of 0.1–0.01 Ohm are quite adequate, and such values limit dissipation losses caused by resistor 40.

At moment $t_0$, current has risen to a positive value. The control component is time-controlled, i.e., timed to cut off at moment $t_0$, or it may operate by current measurement, i.e., cutting off when ceiling value $I_{max}$ has been reached. Positive capture of the ferromagnetic anchor of the valve actuating assembly is assured at moment $t_0$ or open flow of current $I_{max}$, respectively, and the control device then cuts off.

To this end, it is necessary for current flow from positive terminal 14 to ground terminal 16 to be interrupted, in order to turn off thyristor 30. Turnoff of a low-cost thyristor 30 is not possible by means of simple switching; the current through thyristor 30 must by briefly interrupted, as thyristor 30 is turned off only when in a currentless state.

Current interruption is provided by transistor 22, whose base 24 is driven by output 50 of control component 42 such that the junction between collector 26 and emitter 28 is turned on and current flows through transistor 22. Since the resistance of transistor 22 in the saturated state is lower than the combined resistance of thyristor 30 and series-connected ohmic resistor 54, the current flows essentially through transistor 22, and thyristor 30 is turned off. Immediately thereafter, transistor 22 is blocked by corresponding removal of the drive signal to base 24, and subsequent current flow from positive terminal 14 to ground terminal 16 is no longer possible.

The circuit could also be constructed such that thyristor 30 is eliminated, and a single transistor 22 conducts current flow from coil 10 and relaxation circuit element 12 to ground 16. In this case, however, a relatively large power transistor 22 would be required, as currents on the order of 30–50 A (amps) must be carried. Such power transistors are relatively bulky and exceptionally expensive for mass-production applications.

The invention takes advantage of the fact that thyristors are relatively economical components which are well-suited for conducting and, especially, switching high values of current and voltage. As indicated here, transistor 22 must carry the full current for only brief intervals of time; the instantaneous peak current-carrying capability of a transistor can exceed its maximum admissable continuous current rating by a multiple factor without the transistor thereby sustaining damage.

Since the duration of pulse conduction by transistor 22 must extend only until turnoff of thyristor 30, transistor 22 may be significantly underdimensioned relative to maximum current levels encountered, and it is adequate if transistor 22 is designed for very low continuous current levels.

Figure 2:
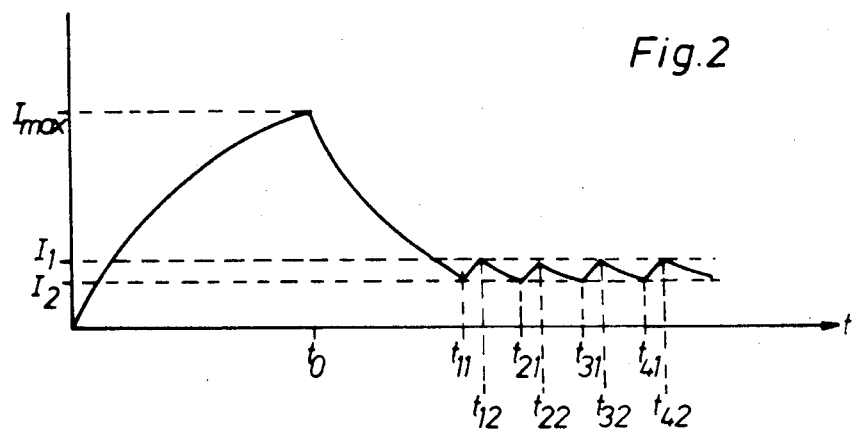
FIG. 2 is a diagram of current flow in the coil 10 of the solenoid current vs time illustrating method aspects of the invention.

Upon current interruption, current flow through the coil does not fall instantaneously; instead, current decays very gradually through relaxation circuit element 12, as seen by the interval $t_0$-$t_{11}$ in FIG. 2.

It is possible to measure this current flow through coil 10 by means of an appropriate measuring instrument, and when the current has reached a threshold value, correspondingly turn on the current again to ensure that the gas intake or exhaust valve anchor remains captured by solenoid core 10 during the anchor's stationary phase. However, this is a relatively costly procedure, as spurious signals are detected during current sampling through the coil, making measurement results uncertain. Moreover, supply voltage fluctuations are reflected as measurement errors.

A fundamental aspect of the invention is the fact that current sampling does not take place in coil 10, or in the current path near coil 10, but instead by means of ohmic resistor 40, one side of which is directly connected to ground terminal 16 and which is resultingly free of parasitics.

As this ohmic resistor 40 does not carry decay current, this current, whose decay characteristic is known on the basis of operating parameters, can be simulated in control component 42. The accuracy obtained in this manner is adequate to ensure safe operation of the circuit and of electromagnetic dissipator 10.

When the simulated decay current has reached a threshold value $I_2$, shown in FIG. 2 at time $t_{11}$, current flow through solenoid 10 is resumed. This can be effected by turning on transistor 22 by a drive signal delivered by control component 42 to base 24, allowing current to flow from positive terminal 14 to ground terminal 16. The current thus rises until time $t_{12}$, when it reaches ceiling value $I_1$ as preset in control component 42; transistor 22 is turned off, and the simulated current falls again to threshold value $I_2$, which it reaches at time $t_{21}$. The cycle is repeated: The current is again turned on, reaches its ceiling value $I_1$ at time $t_{22}$, transistor 22 is again turned off and the decay phase is again simulated.

A pulsed current supply is thus fed to solenoid 10, whereby relatively low current levels are chosen in order to conserve energy. Thanks to the relaxation circuit element, a power pulse is needed only between current on-off switching, the subsequent current decay phase is handled by relaxation circuit element 12 and requires no external current input.

Current levels $I_1$ and $I_2$, between which the current flowing in the circuit varies during the stationary phase of the anchor plate following the capture phase, are roughly 10% to 20% of peak current $I_{max}$ which must be delivered during the capture phase to effect attraction of the ferromagnetic anchor plate to the core face of the solenoid.

It is therefore possible by means of this invention to conduct this significantly lower current of approximately 3-5 A through transistor 22 without any other special safeguards.

Alternatively, it is possible to enable this current to flow, resulting from triggering of thyristor 30, by means of an appropriate signal from output 48 of control component 42 to thyristor gate 36. In this case, as with capture current turnoff, transistor 22 acts only to turn off the thyristor each time current flow is in the order of magnitude of $I_1$.

The moment of current turnon, placed at the origin of the coordinate system in FIG. 2, is signalled to control component 42 via conductor bus 52. Control component 42 also receives turnoff signals over conductor bus 52. The turnoff procedure is not a part of this invention. As indicated in DE-OS No. 28 28 678, interruption of relaxation circuit element 12 is necessary in order to achieve instantaneous turnoff, as current decay would otherwise take place at the usual decay rate through relaxation circuit element 12, even if current supply were blocked.

In accord with the invention the remaining parameters—especially limit values $I_{max}$, $I_1$ and $I_2$—do not have to be supplied to control component 42; these values may be preset in control component 42. Alternatively, however, setting of these parameters via conductor bus 52 is possible independently of the other operating parameters.

Likewise, the decay rate used for simulation of current decay is set in control component 42 itself.

If multiple gas intake or exhaust valves are operated pursuant to the invention in a multiple-cylinder engine, this circuit is particularly advantageous inasmuch as all ohmic resistors 40 can be connected to a common ground point 16, in order to minimize parasitic signals at the input of control component 42. Circuit tolerances, resulting from scatter in the values of components used in the construction of identical circuits, may likewise be optimally limited in this manner.

Figure 3:
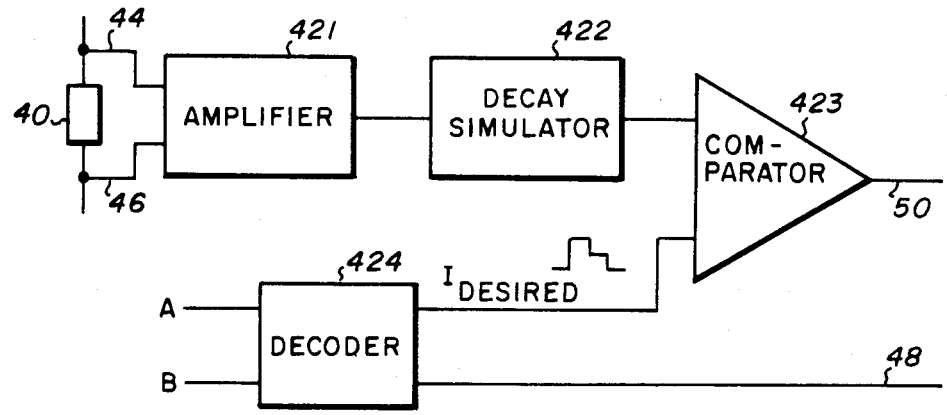
FIG. 3 is a block diagram of the control component assembly.

FIG. 3 is a block diagram of the controller unit 42 and comprises an operational amplifier 421, connected across resistor 40, which provides an input to decay simulator 422, to produce an $I_{real}$ input to comparator 423. The signals A and B input via bus 52 are processed in decoder 424 to produce the $I_{desired}$ waveform which is also input to the comparator 423. The comparator output 50 is input to base 24 of transistor 22. Decoder 424 also provides an output 48 that is input to the gate 36 of thyristor 30.

Figure 4:
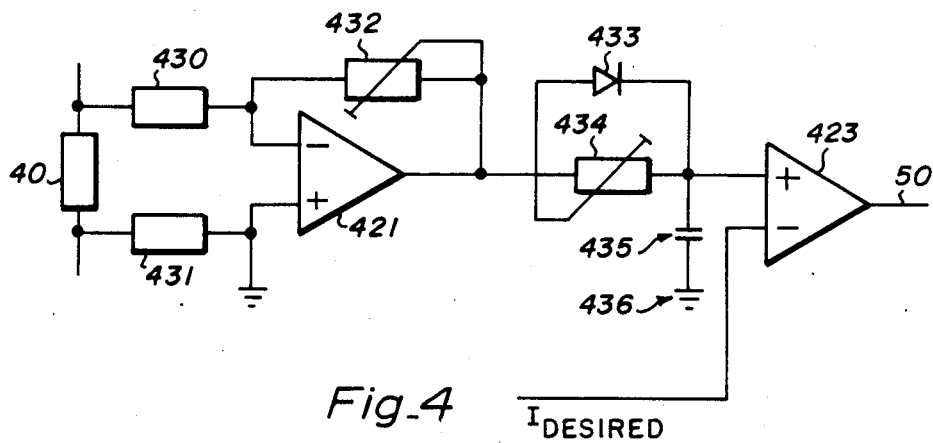
FIG. 4 is a circuit diagram of the amplifier and decay simulator section of the controller.

FIG. 4 is a circuit diagram of the amplifier and decay simulator section of the controller 42. Items 430 and 431 are input resistors which are part of operational amplifier 421, which may be a differential input op amp, having a variable resistance 432 in the feedback loop to set amplifier gain. The decay simulator 422 may comprise a diode 433 in parallel with a variable resistor 434 and a capacitor 435 coupled to ground 436.

The input signals A and B are timing signals, typically of clock type. Signal A commences before B and continues through the decay of holding current peak $t_{42}$ (see FIG. 2). Signal B commences at $t_0$ and continues in duration past, in time, signal A.

I claim:

1. Method of current pulse operation of an actuating assembly associated with a gas intake or exhaust valve in an internal combustion engine, said valve having an actuating solenoid and a ferromagnetic anchor plate attractable thereto, comprising the steps of:

(a) providing a relaxation circuit in parallel with said solenoid and providing a first and second parallel branch current path in series with said solenoid, each branch having a switching element therein, a first branch forming a low capacity current path, both first and second branches together forming a high capacity current path;

(b) energizing said solenoid to capture said anchor plate to hold said valve in a stationary phase by supplying a capture current $I_{max}$ to said solenoid and through the high capacity current path;

(c) permitting said capture current to decay through said relaxation circuit, after said anchor plate capture, to a simulated predetermined threshold value $I_2$;

(d) switching from the high capacity current path to said low capacity current path after reaching I by the first branch becoming a low impedance branch and the second branch becoming nonconductive;

(e) operating the switching element in said low capacity path to draw a holding current through said solenoid on reaching said threshold value $I_2$ and shutting off the current at a measured ceiling value $I_1$ for a selected valve holding time during the stationary phase of said valve action where $I_1 > I_2$ and $I_{max} > I_1$;

(f) measuring said holding current during said current supply to valve $I_1$, and allowing holding current decay to a threshold value $I_2$ by simulating said decay and then repeating steps (d) and (e) for a predetermined time.

2. The method of current pulse operation for a valve actuating solenoid as in claim 1 further defined by providing a current sampling element for measuring holding current at a location.

* * * * *

UNITED STATES PATENT AND TRADEMARK OFFICE
CERTIFICATE OF CORRECTION

PATENT NO. : 4,706,619

DATED : November 17, 1987

INVENTOR(S) : Josef Buchl

It is certified that error appears in the above-identified patent and that said Letters Patent are hereby corrected as shown below:

In column 1, line 64, the word "valve" should be --value--.

In column 7, line 5, the word "valve" should be --value--.

Signed and Sealed this

Third Day of May, 1988

Attest:

DONALD J. QUIGG

Attesting Officer

Commissioner of Patents and Trademarks